(12) United States Patent
Choi et al.

(10) Patent No.: US 9,751,353 B2
(45) Date of Patent: Sep. 5, 2017

(54) METHOD OF IMPROVING SURFACE CURE IN DIGITAL FLEXOGRAPHIC PRINTING PLATES

(71) Applicant: MacDermid Printing Solutions, LLC, Waterbury, CT (US)

(72) Inventors: Jonghan Choi, Smyrna, GA (US); Kerry O'Brate, Decatur, GA (US)

(*) Notice: Subject to any disclaimer, the term of this patent is extended or adjusted under 35 U.S.C. 154(b) by 0 days.

(21) Appl. No.: 15/086,402

(22) Filed: Mar. 31, 2016

(65) Prior Publication Data

US 2016/0207342 A1    Jul. 21, 2016

Related U.S. Application Data

(63) Continuation of application No. 14/328,857, filed on Jul. 11, 2014, now Pat. No. 9,329,480, which is a continuation of application No. 13/591,375, filed on Aug. 22, 2012, now Pat. No. 8,808,968.

(51) Int. Cl.
| | |
|---|---|
| *G03F 7/20* | (2006.01) |
| *B41N 1/12* | (2006.01) |
| *G03F 7/09* | (2006.01) |
| *G03F 7/027* | (2006.01) |
| *G03F 7/32* | (2006.01) |
| *G03F 7/36* | (2006.01) |

(52) U.S. Cl.
CPC .............. *B41N 1/12* (2013.01); *G03F 7/027* (2013.01); *G03F 7/09* (2013.01); *G03F 7/20* (2013.01); *G03F 7/202* (2013.01); *G03F 7/325* (2013.01); *G03F 7/36* (2013.01)

(58) Field of Classification Search
CPC ...................................... G03F 7/20; G03F 7/36
See application file for complete search history.

(56) References Cited

U.S. PATENT DOCUMENTS

| | | |
|---|---|---|
| 3,265,765 A | 8/1966 | Holden et al. |
| 3,721,723 A | 3/1973 | Heidel |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,622,088 A | 11/1986 | Min |
| 5,135,827 A | 8/1992 | Bohm et al. |
| 5,223,375 A | 6/1993 | Berrier et al. |
| 5,262,275 A | 11/1993 | Fan |
| 5,925,500 A | 7/1999 | Yang et al. |
| 6,238,837 B1 | 5/2001 | Fan |
| 6,326,127 B1 * | 12/2001 | Morren ................. C08F 287/00 430/286.1 |
| 6,355,395 B1 * | 3/2002 | Zwez .................... G03F 7/0955 430/271.1 |
| 6,413,699 B1 * | 7/2002 | Kanga ..................... G03F 7/029 430/271.1 |
| RE39,835 E * | 9/2007 | Kanga ..................... G03F 7/029 430/271.1 |
| 7,723,407 B2 | 5/2010 | Sugioka et al. |
| 8,158,331 B2 | 4/2012 | Recchia |
| 2004/0019126 A1 | 1/2004 | Brand et al. |
| 2004/0087687 A1 * | 5/2004 | Yang .................. C08G 59/1466 523/451 |
| 2004/0097678 A1 | 5/2004 | Tsuji et al. |
| 2005/0142480 A1 * | 6/2005 | Bode ....................... G03F 7/115 430/270.1 |
| 2007/0077480 A1 | 4/2007 | Curello et al. |
| 2008/0057316 A1 | 3/2008 | Landon et al. |
| 2009/0042138 A1 | 2/2009 | Roberts et al. |
| 2009/0075199 A1 * | 3/2009 | Lungu ....................... B41C 1/05 430/281.1 |
| 2009/0075205 A1 | 3/2009 | So et al. |
| 2009/0186308 A1 * | 7/2009 | Rudolph ................. B41M 1/04 430/325 |
| 2010/0239789 A1 | 9/2010 | Umeda |
| 2010/0244328 A1 | 9/2010 | Yonezawa et al. |
| 2011/0079158 A1 | 4/2011 | Recchia et al. |
| 2012/0129097 A1 | 5/2012 | Choi et al. |
| 2012/0135354 A1 | 5/2012 | Ali et al. |

FOREIGN PATENT DOCUMENTS

| | | |
|---|---|---|
| EP | 0456336 | 11/1991 |
| EP | 0640878 | 3/1995 |
| GB | 1366769 | 9/1974 |

* cited by examiner

*Primary Examiner* — Chanceity Robinson
(74) *Attorney, Agent, or Firm* — Carmody Torrance Sandak & Hennessey LLP

(57) ABSTRACT

A photocurable relief image printing element is described. The photocurable relief image printing element comprises (a) a support layer; (b) one or more photocurable layers disposed on the support layer, wherein the one or more photocurable layers comprise: (i) a binder; (ii) one or more monomers; (iii) a photoinitiator; and (iv) an additive selected from the group consisting of phosphites, phosphines, thioether amine compounds, and combinations of one or more of the foregoing; (c) a laser ablatable masking layer disposed on the one or more photocurable layers, the laser ablatable masking layer comprising a radiation opaque material; and (d) optionally, a removable coversheet. The photocurable relief image printing element provides improved surface cure in digital relief image printing elements.

17 Claims, 14 Drawing Sheets

METHOD OF IMPROVING SURFACE CURE IN DIGITAL FLEXOGRAPHIC PRINTING PLATES

CROSS REFERENCE TO RELATED APPLICATIONS

This application is a continuation of application Ser. No. 14/328,857, filed on Jul. 11, 2014, now pending, which is a continuation of application Ser. No. 13/591,375, now U.S. Pat. No. 8,808,968, the subject matter of each of which is herein incorporated by reference in its entirety.

FIELD OF THE INVENTION

The present invention relates generally to a method of improving surface cure in digital flexographic printing plates.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography.

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made. A typical flexographic printing plate as delivered by its manufacturer is a multilayered article made of, in order, a backing or support layer; one or more unexposed photocurable layers; optionally a protective layer or slip film; and often, a protective cover sheet.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefins, polyamides, and the like. One widely used support layer is a flexible film of polyethylene terephthalate.

The photocurable layer(s) can include any of the known polymers, monomers, initiators, reactive and/or non-reactive diluents, fillers, and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may also be used.

Photocurable materials generally cross-link (cure) and harden through radical polymerization in at least some actinic wavelength region. As used herein, "actinic radiation" is radiation that is capable of polymerizing, crosslinking or curing the photocurable layer. Actinic radiation includes, for example, amplified (e.g., laser) and non-amplified light, particularly in the UV and violet wavelength regions.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processing steps for forming relief image printing elements typically include the following:

1) Image generation, which may be mask ablation for digital "computer to plate" printing plates or negative production for conventional analog plates;
2) Back exposure to create a floor layer in the photocurable layer and establish the depth of relief;
3) Face exposure through the mask (or negative) to selectively crosslink and cure portions of the photocurable layer not covered by the mask, thereby creating the relief image;
4) Development to remove unexposed photopolymer by solvent (including water) or thermal development; and
5) If necessary, post exposure and detackification.

Removable coversheets are also preferably provided to protect the photocurable printing element from damage during transport and handling. Prior to processing the printing elements, the coversheet is removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer solvent (or alternatively, thermal development) removes the unexposed areas of the photopolymerizable layer, leaving behind a printing relief that can be used for flexographic printing.

As used herein "back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Following the brief back exposure step (i.e., brief as compared to the imagewise exposure step which follows), an imagewise exposure is performed utilizing a digitally-imaged mask or a photographic negative mask, which is in contact with the photocurable layer and through which actinic radiation is directed.

The type of radiation used is dependent on the type of photoinitiator in the photopolymerizable layer. The digitally-imaged mask or photographic negative prevents the material beneath from being exposed to the actinic radiation and hence those areas covered by the mask do not polymerize, while the areas not covered by the mask are exposed to actinic radiation and polymerize. Any conventional sources of actinic radiation can be used for this exposure step. Examples of suitable visible and UV sources include carbon arcs, mercury-vapor arcs, fluorescent lamps, electron flash units, electron beam units, LEDs and photographic flood lamps.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or thermal development, which typically uses heat plus a blotting material. The resulting surface has a relief pattern, which typically comprises a plurality of dots that reproduces the image to be printed. After the relief image is developed, the resulting relief image printing element may be mounted on a press and printing commenced. In addition, if necessary, after the development step, the relief image printing element may be post exposed and/or detackified as is generally well known in the art.

The shape of the dots and the depth of the relief, among other factors, affect the quality of the printed image. In addition, it is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (i.e., the dot is not "held" on plate and/or on press). Alternatively, if the dots survive processing they are susceptible to damage on press. For example small dots often fold over and/or partially break off during printing, causing either excess ink or no ink to be transferred.

As described in U.S. Pat. No. 8,158,331 to Recchia and U.S. Pat. Pub. No. 2011/0079158 to Recchia et al., the subject matter of each of which is herein incorporated by reference in its entirety, it has been found that a particular set of geometric characteristics define a flexo dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder.

Furthermore, in order to improve surface cure, it has generally been found that it can be beneficial to perform additional procedures and/or use additional equipment. These additional procedures and/or equipment may include:

(1) laminating a membrane onto the surface of the photopolymer;

(2) purging oxygen from the photopolymer using an inert gas; or (3) imaging the photopolymer with a high intensity UV source.

Purging oxygen from the photopolymer using an inert gas typically involves placing the photocurable resin plate in an atmosphere of inert gas, such as carbon dioxide gas or nitrogen gas, before exposure, in order to displace the environmental oxygen. A noted drawback to this method is that it is inconvenient and cumbersome and requires a large space for the apparatus.

Another approach involves subjecting the plates to a preliminary exposure (i.e., "bump exposure") of actinic radiation. During bump exposure, a low intensity "pre-exposure" dose of actinic radiation is used to sensitize the resin before the plate is subjected to the higher intensity main exposure dose of actinic radiation. The bump exposure is typically applied to the entire plate area and is a short, low dose exposure of the plate that reduces the concentration of oxygen, which inhibits photopolymerization of the plate (or other printing element) and aids in preserving fine features (i.e., highlight dots, fine lines, isolated dots, etc.) on the finished plate. However, the pre-sensitization step can also cause shadow tones to fill in, thereby reducing the tonal range of the halftones in the image. In the alternative, a selective preliminary exposure, as discussed for example in U.S. Patent Publication No. 2009/0043138 to Roberts et al., the subject matter of which is herein incorporated by reference in its entirety, has also been proposed. Other efforts to reduce the effects of oxygen on the photopolymerization process have involved special plate formulations alone or in combination with the bump exposure.

As is readily apparent, all of these techniques involve unavoidable costs such as capital expenses on equipment, space, consumables, inert gases, license fees, etc. Thus, it would be desirable to provide a relief image printing element having improved surface cure without needing to subject the printing element to any additional processing steps. Also, it would be desirable to provide a digital relief image printing element that comprises printing dots having a desirable shape and desirable depth of relief without needing to subject the relief image printing element to any additional procedures.

The inventors of the present invention have found that the inclusion of particular additives in the photocurable layer of the relief image printing element, as described herein, produces relief image printing element that comprise dots having desirable shapes and depth of relief.

SUMMARY OF THE INVENTION

It is an object of the present invention to provide a relief image printing element having improved surface cure.

It is another object of the present invention to provide a method of tailoring or modifying the shape of relief printing dots in a relief image printing element for optimal printing on various substrates and/or under various conditions.

It is another object of the present invention to provide an improved method of producing relief image printing elements comprising dots having desirable geometric characteristics.

It is still another object of the present invention to greatly streamline the workflow of the digital platemaking process.

It is another object of the present invention to provide an improved method of creating a relief image printing element having tailored relief dots in terms of edge definition, shoulder angle, and/or print surface.

To that end, in one embodiment, the present invention relates generally to a photocurable relief image printing element comprising:
 a) a support layer;
 b) one or more photocurable layers disposed on the support layer, wherein the one or more photocurable layers comprise:
  i) a binder;
  ii) one or more monomers;
  iii) a photoinitiator; and
  iv) an additive selected from the group consisting of phosphites, phosphines, thioether amine compounds, and combinations of one or more of the foregoing;
 c) a laser ablatable masking layer disposed on the one or more photocurable layers, the laser ablatable masking layer comprising a radiation opaque material; and
 d) optionally, a removable coversheet.

In another embodiment, the present invention relates generally to a method of producing a relief image printing element from a photocurable printing blank, the method comprising the steps of:
 a) providing a photocurable printing blank, the photocurable printing blank comprising:
  i) a backing or support layer;
  ii) one or more photocurable layers disposed on the backing or support layer, wherein the one or more photocurable layers comprise:
   1) a binder;
   2) one or more monomers;
   3) a photoinitiator; and
   4) an additive selected from the group consisting of phosphites, phosphines, thioether amine compounds, and combinations of one or more of the foregoing;
  iii) a laser ablatable masking layer disposed on the at least one photocurable layer, the laser ablatable masking layer comprising a radiation opaque material;
 b) selectively ablating the laser ablatable mask laser to create an in situ negative of a desired image in the laser ablatable mask layer;
 c) exposing the at least one photocurable layer to actinic radiation through the in situ negative to selectively crosslink and cure portions of the at least one photocurable layer; and
 d) developing the exposed at least one photocurable layer of the photocurable printing blank to reveal the relief image therein, said relief image comprising a plurality of relief printing dots.

DETAILED DESCRIPTION OF THE PREFERRED EMBODIMENTS

Figure 1A:
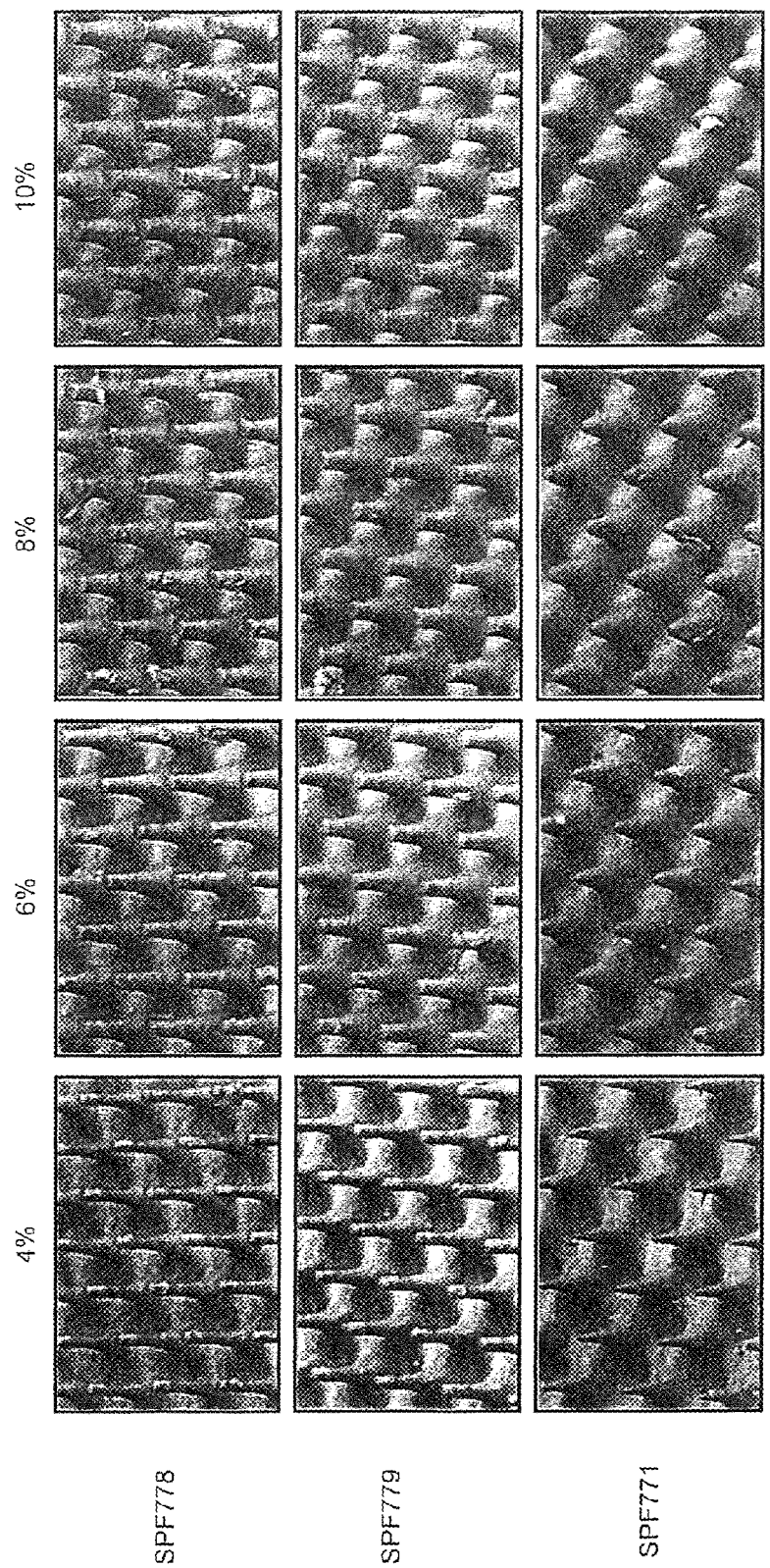
FIGS. 1A and 1B depict SEM pictures of SPF778, SPF779 and SPF771 processed in solvent.
Figure 1B:
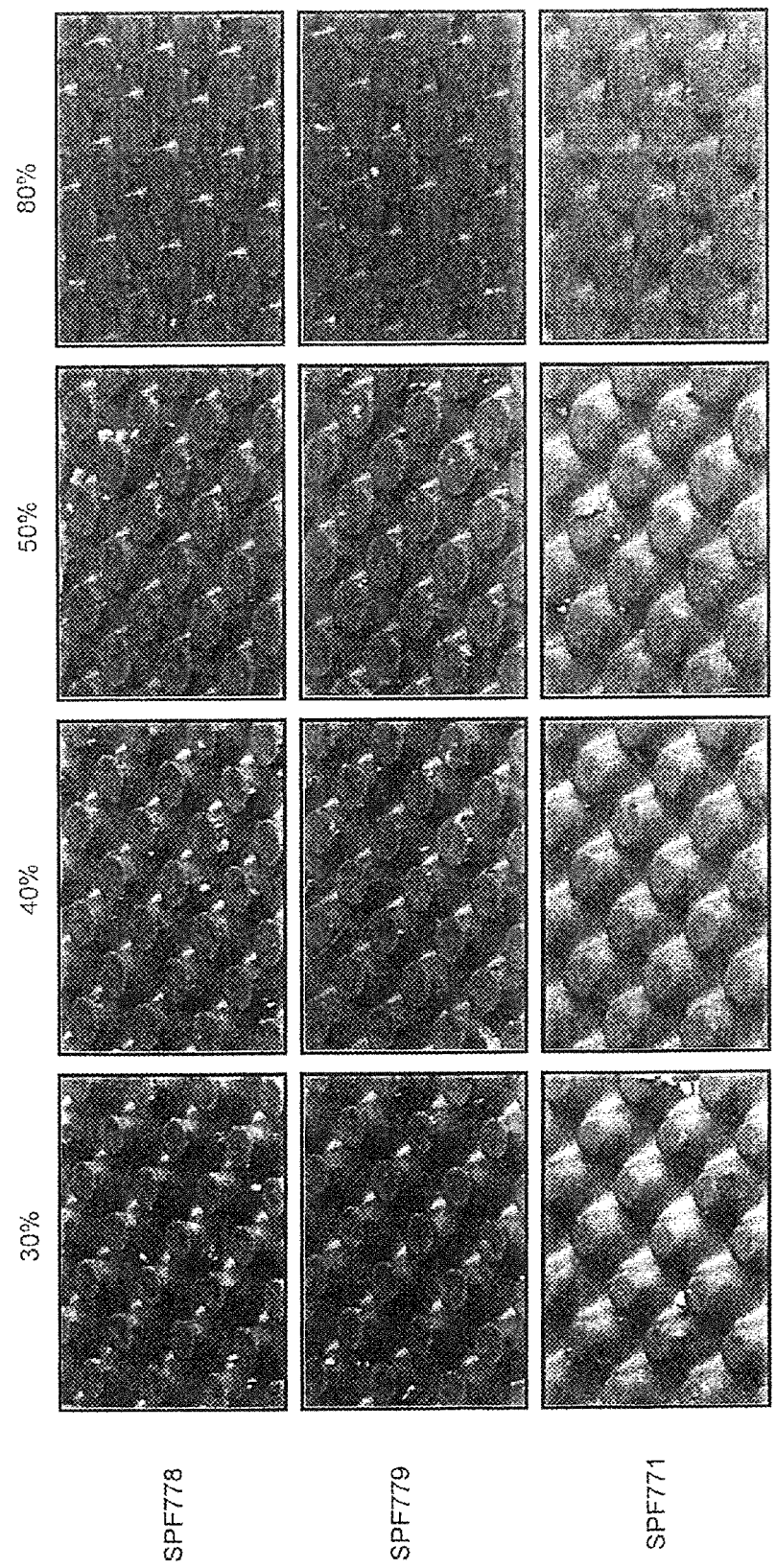
Figure 2A:
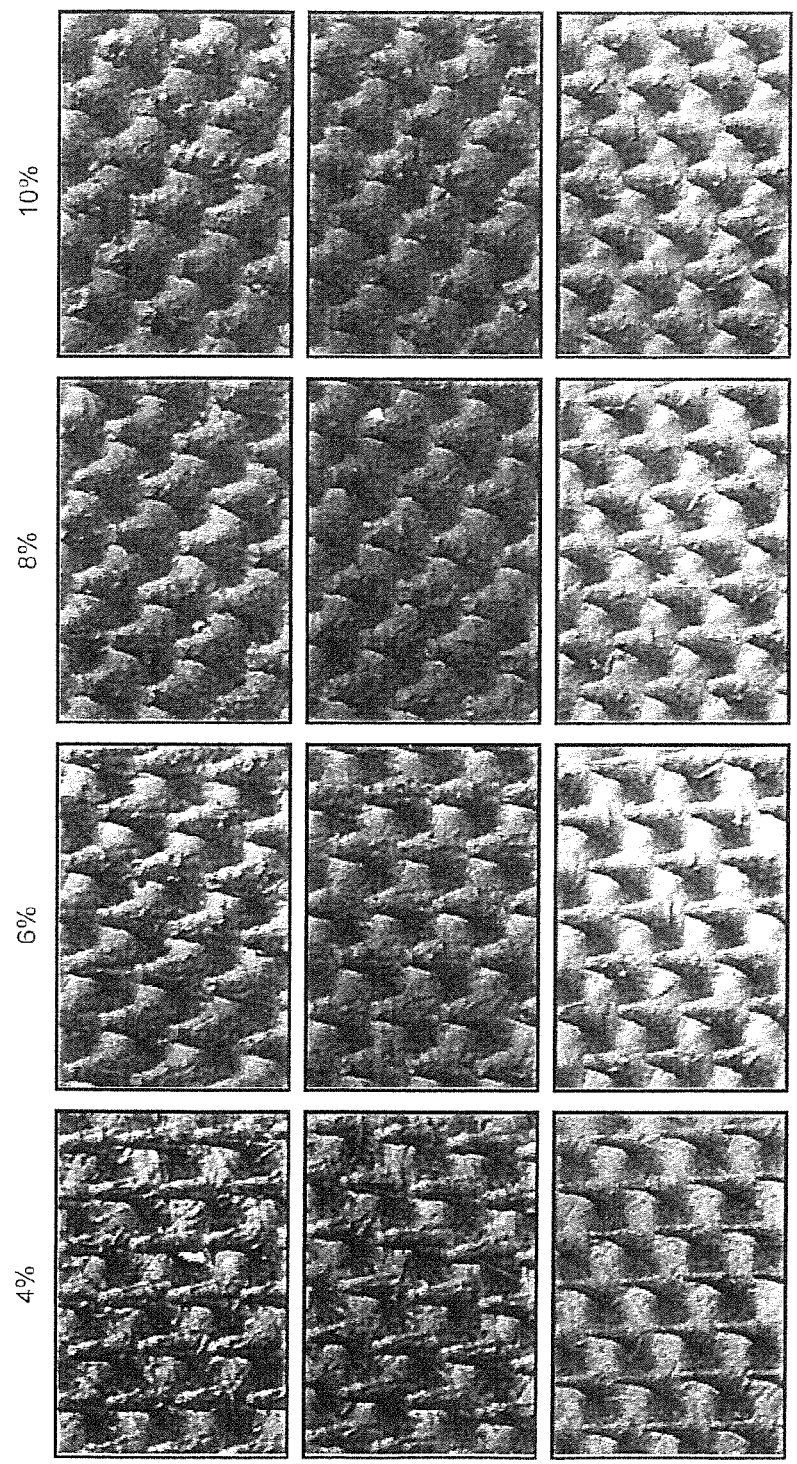
FIGS. 2A and 2B depict SEM pictures of SPF778, SPF779 and SPF771 processed thermally.
Figure 2B:
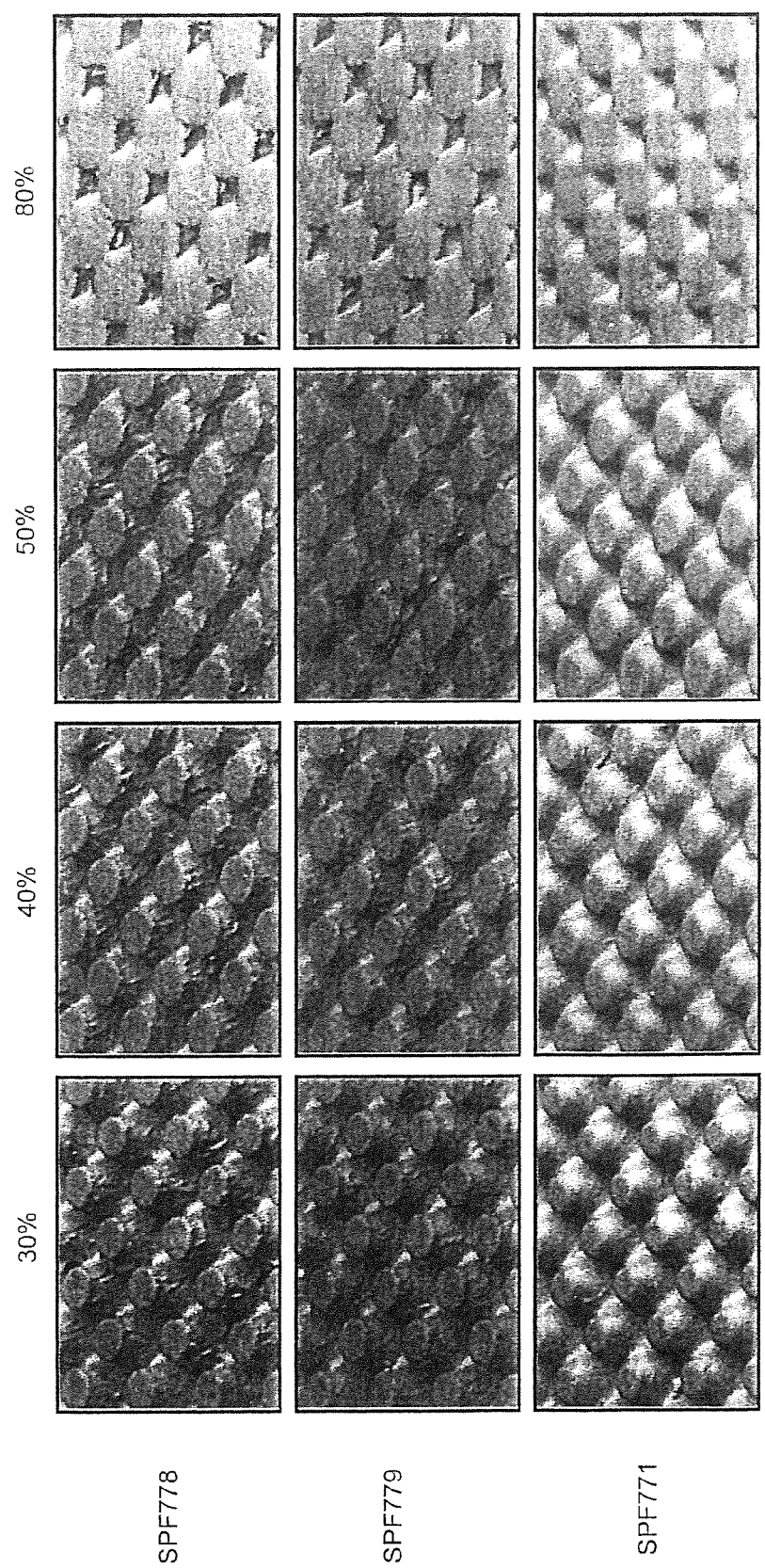

Upon UV-curing in the presence of oxygen, the surface properties of a given photopolymer can be quite different from its bulk properties. This is mainly because oxygen inhibition strongly affects the surface layer upon UV exposure, thus disproportionately suppressing the curing reaction in the surface layer compared to the bulk. As a result, the most desirable properties for end-use product performance are not attained. In addition, the poor surface cure can significantly alter the size and shape of the relief features formed in the photopolymer by UV curing.

One such example is found in digital flexographic printing plates. Due to problems with curing the photopolymer layer, the following effects are typically observed:
 (1) Smaller dot sizes than intended. Digital plates require "bumps" that artificially employ larger dot sizes in an electronic file to render the intended sizes on the plates, thus truncating the overall tonal.
 (2) Poorly defined imaging edges particularly in the dot shapes, i.e., round top dots (RTD) instead of flat top dots (FTD), which contribute to high dot gains upon impression during printing.
 (3) High surface roughness of solids upon thermal processing, which adversely influences solid ink density (SID).

These shortcomings negatively affect printing quality and often times even limit the applications of digital plates.

To overcome these drawbacks, the inventors of the present invention have found that the introduction of particular additives into the photocurable composition of flexographic printing plates greatly improve the curing reaction in the surface layer. The significance of this invention lies in the fact that the surface cure can be greatly enhanced, without resorting to additional technology (including high intensity UV sources, inert gas chambers, membrane lamination, etc.). Furthermore, the conventional practice of applying bumps to the electronic files to obtain intended dot sizes can also be reduced or eliminated. In short, the present invention can greatly streamline the platemaking process and save costs required to support the conventional procedure, equipment and techniques, without compromising desirable characteristics resulting from good surface cure.

Based thereon, in one embodiment, the present invention relates generally to a photocurable relief image printing element comprising:
  a) a support layer;
  b) one or more photocurable layers disposed on the support layer, wherein the one or more photocurable layers comprise:
    i) a binder;
    ii) one or more monomers;
    iii) a photoinitiator; and
    iv) an additive selected from the group consisting of phosphites, phosphines, thioether amine compounds, and combinations of one or more of the foregoing;
  c) a laser ablatable masking layer disposed on the one or more photocurable layers, the laser ablatable masking layer comprising a radiation opaque material; and
  d) optionally, a removable coversheet.

As described herein, the additives may comprise phosphites, having the general structure $P(OR)_3$ or $P(OAr)_3$, phosphines, having the general structure $PR_3$ or $PAr_3$, thioether amine compounds, or combinations of one or more of the foregoing. The additive(s) may be used in the photopolymer composition in an amount of about 0.1 to about 10% by weight, more preferably in an amount of about 0.05 to about 2% by weight.

Suitable phosphites include, but are not limited to, tris(nonylphenyl)phosphite (TNPP) CAS No. 26523-78-4, triphenyl phosphite, diphenyl phosphite, tridecyl phosphite, triisodecyl phosphite, tris(tridecyl)phosphite, trilauryl phosphite, disteraryl pentaerythriol diphosphite, diisodecyl phenyl phosphite, diphenyl isodecyl phosphite, diphenyl octyl phosphite, diphenyl isooctyl phosphite, diphenyl tri isodecyl monophenyl dipropyleneglycol diphosphite, alkyl bisphenol A phosphite, tetraphenyl dipropyleneglycol diphosphite, poly(dipropyleneglycol) phenyl phosphite, tris(dipropylene glycol) phosphite, and dioleyl hydrogen phosphate. In one embodiment, the phosphite comprises TNPP.

Suitable phosphines include, but are not limited to, triphenyl phosphine, tri-p-tolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, divinyl-p-bromophenylphosphine, and diallyl-p-tolylphosphine.

Suitable thioether amine compounds include, but are not limited to, 2,6-di-tert-butyl-4-(4,6-bis(octylthio)-1,3,5-triazin-2-ylamino)phenol (CAS No. 991-84-4), 4-[[4,6-bis(nonylsulfanyl)-1,3,5-triazin-2-yl]amino]-2,6-ditert-butylphenol, 4-[[4,6-bis(octadecylsulfanyl)-1,3,5-triazin-2-yl]amino]-2,6-ditert-butylphenol, 4-[[4,6-octylsulfanyl)-1,3,5-triazin-2-yl]amino]-2,6-bis(2-methylnonan-2-yl)phenol, 4-[[4,6-bis(hexylsulfanyl)-1,3,5-triazin-2-yl]amino]-2,6-ditert-butylphenol, 4-[[4,6-bis(heptylsulfanyl)-1,3,5-triazin-2-yl]amino]-2,6-ditert-butylphenol, 4-[[4,6-bis(octylsulfanyl)-1,3,5-triazin-2-yl]amino]-2-tert-butyl-6-methylphenol, 4-[[4,6-bis(ethylsulfanyl)-1,3,5-triazin-2-yl]amino]-2,6-ditert-butylphenol, 4-[[4,6-bis(2,4,4-trimethylpentan-2-ylsulfanyl)-1,3,5-triazin-2-yl]amino]-2,6-ditert-butylphenol, 4-[[4,6-bis(2-octylsulfanylethylsulfanyl)-1,3,5-triazin-2-yl]amino]-2,6-ditert-butylphenol, 4-[[4,6-bis(octylsulfanyl)-1,3,5-triazin-2-yl]amino]-2,6-dibutylphenol, 4-[[4,6-bis(octylsulfanyl)-1,3,5-triazin-2-yl]amino]-2,6-dimethylphenol, 2,6-ditert-butyl-4-[[4-(3,5-ditert-butyl-4-hydroxyanilino)-6-octylsulfanyl-1,3,5-triazin-2-yl]amino]phenol, 4-[[4,6-bis(pentylsulfanyl)-1,3,5-triazin-2-yl]amino-2,6-dimethylphenol, 4-[[4,6-bis(hexylsulfanyl)-1,3,5-triazin-2-yl]amino]-2-tert-butylphenol, 2,6-ditert-butyl-4-[(4-octylsulfanyl-1,3,5-triazin-2-yl)amino]phenol, 4-[[4,6-bis(ethylsulfanyl)-1,3,5-triazin-2-yl]amino]-2,6-dimethylphenol, 4-[[4,6-bis(octylsulfanyl)-1,3,5-triazin-2-yl]-butylamino]-2,6-ditert-butylphenol, 4-[[4,6-bis(octylsulfanyl)-1,3,5-triazin-2-yl]-cyclohexylamino]-2,6-ditert-butylphenol, 2-[[4,6-bis(octylsulfanyl)-1,3,5-triazin-2-yl]amino]-6-tert-butylphenol, 2-tert-butyl-6-methyl-4-[[4-octylsulfanyl-6-[(2,2,6,6,-tetramethylpiperidin-4-yl)amino]-1,3,5-triazin-2-yl]amino]phenol, 4-[[4,6-bis(octylsulfanylmethyl)-1,3,5-triazin-2-yl)amino]-2,6-ditert-butylphenol, 4-[[4,6-bis(octylsulfanyl)-1,3,5-triazin-2-yl)methylamino]-2,6-ditert-butylphenol, 4-[(4-amino-6-chloro-1,3,5-triazin-2-yl)amino]-2,6-ditert-butylphenol, and 4-[(4-cyclohexyl-6-cyclohexylsulfanyl-1,3,5-triazin-2-yl)amino]-2,6-di (propan-2-yl)phenol. In one embodiment, the thioether amine compound comprises 2,6-di-tert-butyl-4-(4,6-bis(octylthio)-1,3,5-triazin-2-ylamino)phenol (also referred to as phenol,4-[[4,6-bis(octylthio)-1,3,5-triazin-2-yl]amino]-2,6-bis(1,1-dimethylethyl).

In addition, one or more antioxidants such as 1,3,5-trimethyl-2,4,6-tris(3,5-di-tert-butyl-4-hydroxybenzyl)benzene, butylated hydroxytoluene (BHT), alkylated phenols, e.g., 2-6-di-tert-butyl-4-methylphenol; alkylated bis-phenols, e.g., 2,2-methylene-bis-(4-methyl-6-tert-butylphenol); 2-(4-hydroxy-3,5-di-tert-butylanilino)-4,6-bis-(n-octyl thio)-1,3,5-triazine; polymerized trimethyldihydroquinone; and dilauryl thiopropionate can also be used in the compositions of the invention in combination with the above referenced additives to further tailor dot shapes in terms of dot angle, dot tops, etc. In one preferred embodiment, the antioxidant is 1,3,5-trimethyl-2,4,6-tris-(3,5-di-tert-butyl-4-hydroxybenzyl) benzene, available from Albemarle under the tradename Ethanox 330.

The photopolymerizable composition of the present invention comprises one or more binders, monomers and plasticizers in combination with one or more photoinitiators and the above-described additives.

The binder type is not critical to the photopolymer composition and most, if not all, styrenic copolymer rubbers are usable in the compositions of the invention. Suitable binders can include natural or synthetic polymers of conjugated diolefin hydrocarbons, including 1,2-polybutadiene, 1,4-polybutadiene, butadiene/acrylonitrile, butadiene/styrene, thermoplastic-elastomeric block copolymers e.g., styrene-butadiene-styrene block copolymer, styrene-isoprene-styrene block copolymer, etc., and copolymers of the binders. It is generally preferred that the binder be present in at least an amount of 60% by weight of the photosensitive layer. The term binder, as used herein, also encompasses core shell microgels or blends of microgels and pre-formed macromolecular polymers.

Non-limiting examples of binders that are usable in the compositions of the instant invention include styrene isoprene styrene (SIS), a commercial product of which is available from Kraton Polymers, LLC under the tradename Kraton® D1161; styrene isoprene butadiene styrene (SIBS), a commercial product of which is available from Kraton Polymers, LLC under the tradename Kraton® D1171; and styrene butadiene styrene (SBS), a commercial product of which is available from Kraton Polymers LLC under the tradename Kraton® DX405.

Monomers suitable for use in the present invention are addition-polymerizable ethylenically unsaturated compounds. The photocurable composition may contain a single monomer or a mixture of monomers which form compatible mixtures with the binder(s) to produce clear (i.e., non-cloudy) photosensitive layers. The monomers are typically reactive monomers especially acrylates and methacrylates. Such reactive monomers include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-imethylolpropane tetraacrylate, triacrylate of tris(hydroxyethyl) isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product. Monoacrylates including, for example, cyclohexyl acrylate, isobornyl acrylate, lauryl acrylate and tetrahydrofurfuryl acrylate and the corresponding methacrylates are also usable in the practice of the invention. Especially preferred acrylate monomers include hexanediol diacrylate (HDDA) and trimethylolpropane triacrylate (TMPTA). Especially preferred methacrylate monomers include hexanediol dimethacrylate (HDDMA) and triemethylolpropane trimethacrylate (TMPTA). It is generally preferred that the one or more monomers be present in at least an amount of 5% by weight of the photosensitive layer.

The photopolymer layer preferably contains a compatible plasticizer, which serves to lower the glass transition temperature of the binder and facilitate selective development. Suitable plasticizers include, but are not limited to, dialkyl phthalates, alkyl phosphates, polyethylene glycol, polyethylene glycol esters, polyethylene glycol ethers, polybutadiene, polybutadiene styrene copolymers, hydrogenated, heavy naphthenic oils, hydrogenated, heavy paraffinic oils, and polyisoprenes. Other useful plasticizers include oleic acid, lauric acid, etc. The plasticizer is generally present in an amount of at least 10% by weight, based on weight of total solids of the photopolymer composition. Commercially available plasticizers for use in compositions of the invention include 1,2-polybutadiene, available from Nippon Soda Co. under the tradename Nisso PB B-1000; Ricon 183, which is a polybutadiene styrene copolymer, available from Cray Valley; Nyflex 222B, which is a hydrogenated heavy naphthenic oil, available from Nynas AB; ParaLux 2401, which is a hydrogenated heavy paraffinic oil, available from Chevron U.S.A., Inc.; and Isolene 40-S, which is a polyisoprene available from Royal Elastomers.

Photoinitiators for the photocurable composition include the benzoin alkyl ethers, such as benzoin methyl ether, benzoin ethyl ether, benzoin isopropyl ether and benzoin isobutyl ether. Another class of photoinitiators are the dialkoxyacetophenones such as 2,2-dimethoxy-2-phenylacetophenone and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenylbutyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-o-tolyl-phosphine are also operable herein as photoinitiators.

Preferred photoinitiators for use in the photopolymer compositions of the invention include benzyl dimethyl ketal, a commercial product of which is available from BASF under the Tradename Irgacure 651; α-hydroxyketone, a commercial product of which is available from BASF under the tradename Irgacure 184; and acyl phosphine, a commercial product of which is available from Ciba Specialty Chemicals under the tradename Darocur TPO. In one embodiment, it was determined that Irgacure 651 was the most effective photoinitiator for UV light with the wavelength of ~365 nm to obtain the benefits described herein, but other photoinitiators can also be used, alone or in combination with Irgacure 651.

Various dyes and/or colorants may also optionally be used in the practice of the invention although the inclusion of a dye and/or colorant is not necessary to attain the benefits of the present invention. Suitable colorants are designated "window dyes" which do not absorb actinic radiation in the region of the spectrum that the initiator present in the composition is activatable. The colorants include, for example, CI 109 Red dye, Methylene Violet (CI Basic Violet 5), "Luxol" Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), Rhodamine 3 GO (CI Basic Red 4), Rhodamine 6 GDN (CI Basic Red 1 or CI 45160), 1,1'-diethyl-2,2'-cyanine iodide, Fuchsine dye (CI 42510), Calcocid Green S (CI 44090) and Anthraquinone Blue 2 GA (CI Acid Blue 58), etc. The dyes and/or colorants must not interfere with the imagewise exposure.

Other additives including antiozonants, fillers or reinforcing agents, thermal polymerization inhibitors, UV absorbers, etc. may also be included in the photopolymerizable composition, depending on the final properties desired. Such additives are generally well known in the art.

Suitable fillers and/or reinforcing agents include immiscible, polymeric or nonpolymeric organic or inorganic fillers or reinforcing agents which are essentially transparent at the wavelengths used for exposure of the photopolymer material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

Thermal polymerization inhibitors include, for example, p-methoxyphenol, hydroquinone, and alkyl and aryl-substituted hydroquinones and quinones, tert-butyl catechol, pyrogallol, copper resinate, naphthalamines, beta-naphthol, cuprous chloride, 2,6-di-tert-butyl-p-cresol, butylated hydroxytoluene (BHT), oxalic acid, phenothiazine, pyridine, nitrobenzene and dinitrobenzene, p-toluquinone and chloranil. Other similar polymerization inhibitors would also be usable in the practice of the invention.

In another embodiment, the present invention relates generally to a method of producing a relief image printing element from a photocurable printing blank, the method comprising the steps of:

a) providing a photocurable printing blank, the photocurable printing blank comprising:
  i) a backing or support layer;
  ii) one or more photocurable layers disposed on the backing or support layer, wherein the one or more photocurable layers comprise:
    1) a binder;
    2) one or more monomers;
    3) a photoinitiator; and
    4) an additive selected from the group consisting of phosphites, phosphines, thioether amine compounds, and combinations of one or more of the foregoing;
  iii) a laser ablatable masking layer disposed on the at least one photocurable layer, the laser ablatable masking layer comprising a radiation opaque material;
b) selectively ablating the laser ablatable mask laser to create an in situ negative of a desired image in the laser ablatable mask layer;
c) exposing the at least one photocurable layer to actinic radiation through the in situ negative to selectively crosslink and cure portions of the at least one photocurable layer; and
d) developing the exposed at least one photocurable layer of the photocurable printing blank to reveal the relief image therein, said relief image comprising a plurality of relief printing dots.

Table 1 summarizes various examples of various formulae of photocurable compositions prepared in accordance with the present invention. SPF778 and SPF779 contain both TNPP and 2,6-di-tert-butyl-4-(4,6-bis(octylthio)-1,3,5-triazin-2-ylamino)phenol in combination with Ethanox® 330. SPF802 incorporates 2,6-di-tert-butyl-4-(4,6-bis(octylthio)-1,3,5-triazin-2-ylamino)phenol and SPF803 and SPF814 employ TNPP, respectively.

TABLE 1

Various formulae prepared in accordance with the present invention (% by wt.)

| Component | SPF 771 | SPF778 | SPF779 | SPF802 | SPF803 | SPF814 |
| --- | --- | --- | --- | --- | --- | --- |
| Binder | 66.38 | 66.90 | 66.90 | 66.93 | 66.93 | 66.38 |
| Plasticizer | 19.88 | 19.88 | 19.88 | 19.88 | 19.88 | 19.86 |
| Acrylate Monomer | 6.59 | 6.59 | 6.59 | 6.59 | 6.59 | 6.95 |

TABLE 1-continued

Various formulae prepared in accordance with the present invention (% by wt.)

| Component | SPF 771 | SPF778 | SPF779 | SPF802 | SPF803 | SPF814 |
| --- | --- | --- | --- | --- | --- | --- |
| Methacrylate Monomer | 2.26 | 2.26 | 2.26 | 2.26 | 2.26 | — |
| Irgacure 651 | 2.95 | 2.95 | 2.95 | 2.95 | 2.95 | 5.00 |
| Additive[1] | — | 0.47 | 0.25 | 1.38 | — | — |
| Ethanox 330 | — | 0.36 | 0.56 | — | — | — |
| TNPP | — | 0.55 | 0.57 | — | 1.38 | 1.80 |
| Polymerization inhibitor | 1.92 | — | — | — | — | — |
| Savinyl Red 3BLS | 0.01 | 0.01 | 0.01 | 0.01 | 0.01 | 0.01 |
| Tinuvin 1130 | 0.025 | 0.025 | 0.025 | — | — | — |
| Total | 100 | 100 | 100 | 100 | 100 | 100 |

[1]2,6-di-tert-butyl-4-(4,6-bis(octylthio)-1,3,5-triazin-2-ylamino)phenol

These various photocurable compositions were imagewise exposed to actinic radiation and developed to reveal the relief image therein comprising a plurality of relief printing dots. The resulting photocured compositions comprising the plurality of relief printing dots were then examined. As described herein, the photocurable compositions were developed using a solvent to dissolve away the uncured and uncrosslinked portions of the photocurable composition or were developed using thermal development in which the uncured and uncrosslinked portions were softened and/or melted and then blotted away. Other means of developing the photocurable compositions would also be known to those skilled in the art.

The photocurable relief image printing element preferably has a Shore A hardness of between about 45 and about 70, more preferably between about 50 and about 65.

The improved surface cure in the digital flexographic printing plates can most explicitly be revealed by the dot shapes.

FIGS. 1A, 1B, 2A, and 2B depict SEM pictures of SPF778, SPF779, and SPF771 processed in solvent and thermally, respectively, with regard to dot sizes in the linear electronic file used or imaging at 150 lpi. It is clearly shown that, unlike the conventional RTD of SPF771, FTD are created in both SPF778 and SPF779.

For SPF778 and SPF779 the average dot shoulder angles are very small as exhibited in FIGS. 1A, 1B, 2A, and 2B. In one embodiment, an average shoulder angle, as measured as the angle between a shoulder of the dot across the width of the dot's top or printing surface is less than about 30°, preferably less than about 20°.

In summary, the unique dot shapes of SPF778 and SPF779 are considered ideal for printing because:
  (i) The dots tops are flat and hence require less impression than conventional RTD, which in turn increases plate longevity due to less susceptibility to wear.
  (ii) The pillars of the dots sitting on the bases are practically vertical (no shoulders), which minimizes potential dot gains upon impression.
  (iii) The dot bases are broad, as clearly illustrated in FIGS. 1A, 1B, 2A, and 2B, and thus provide the mechanical stability necessary to endure impact from the unidirectional dynamic impression applied during printing.

Figure 8:
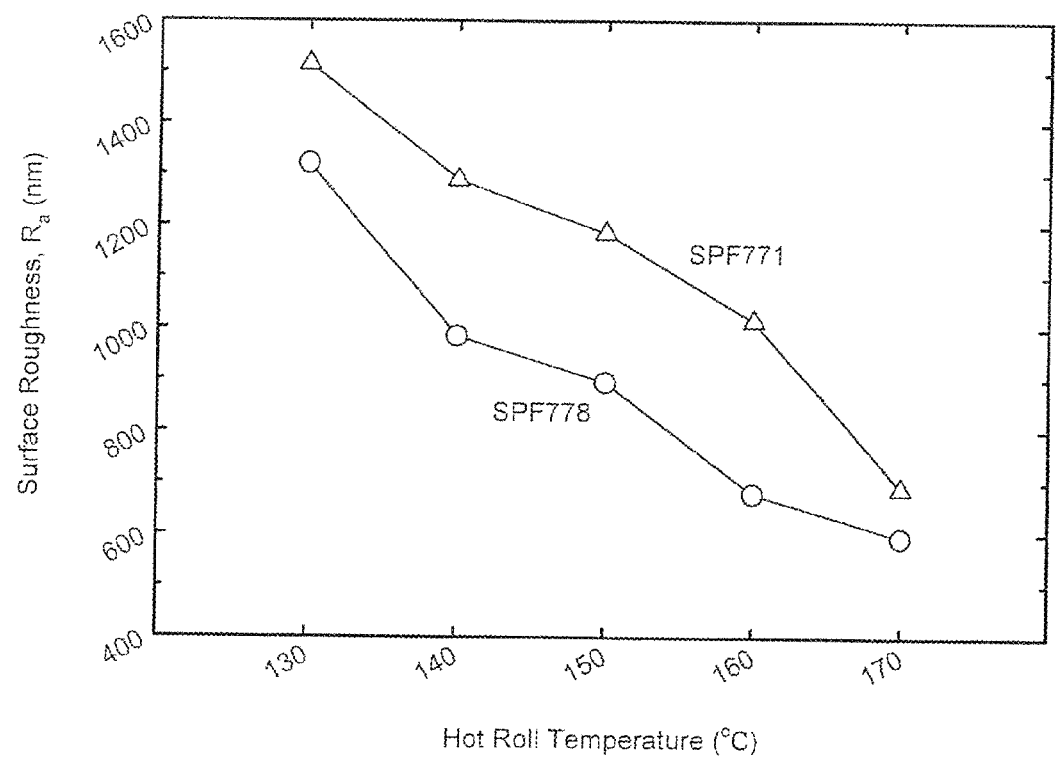
FIG. 8 depicts surface roughness (SR) of SPF771 and SPF778 upon thermal processing with respect to hot roll temperatures.
Figure 9:
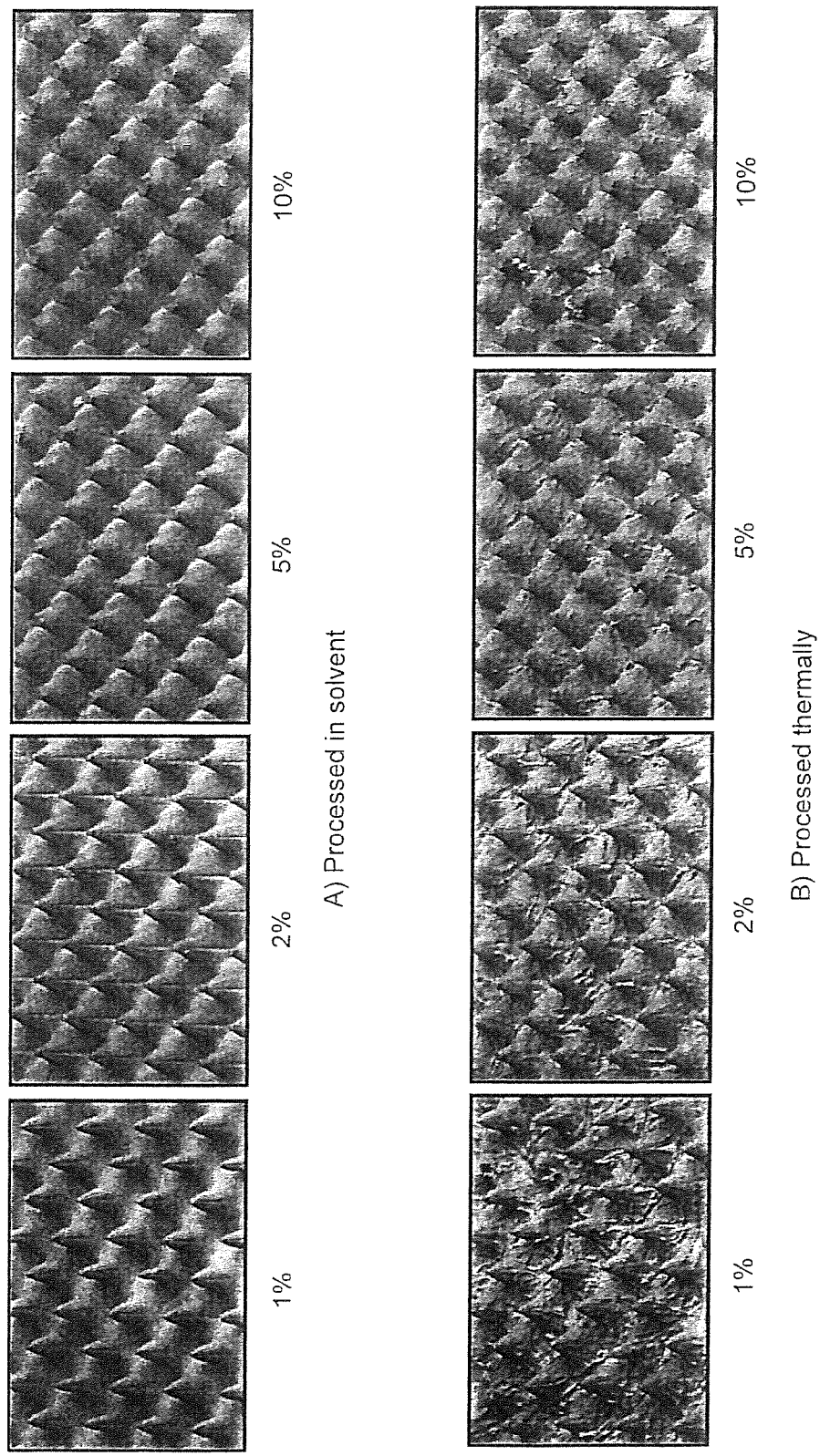
FIG. 9 depicts SEM pictures (150×) of SPF814 processed A) in solvent and B) thermally.

In addition to FTD without shoulder and the elimination of bumps, surface roughness (SR) of solids upon thermal processing is also positively influenced by the improved surface cure, in a manner that the higher the surface cure, the lower the SR. FIG. 8 displays the SR of SPF778 and SPF771 upon thermal processing with respect to hot roll temperature. Over the entire temperature range examined, the SR is lower for SPF778 than for SPF771. This is directly translated into a more forgiving thermal processing. In addition, the lower SR is conducive to increasing solid ink density (SID) upon printing. Thus, it can be seen that the present invention benefits both thermal processing and end-use plate performance in the following manner, as a result of the reduced SR:

(a) Wider thermal processing windows; and
(b) High SID.

Figure 10:
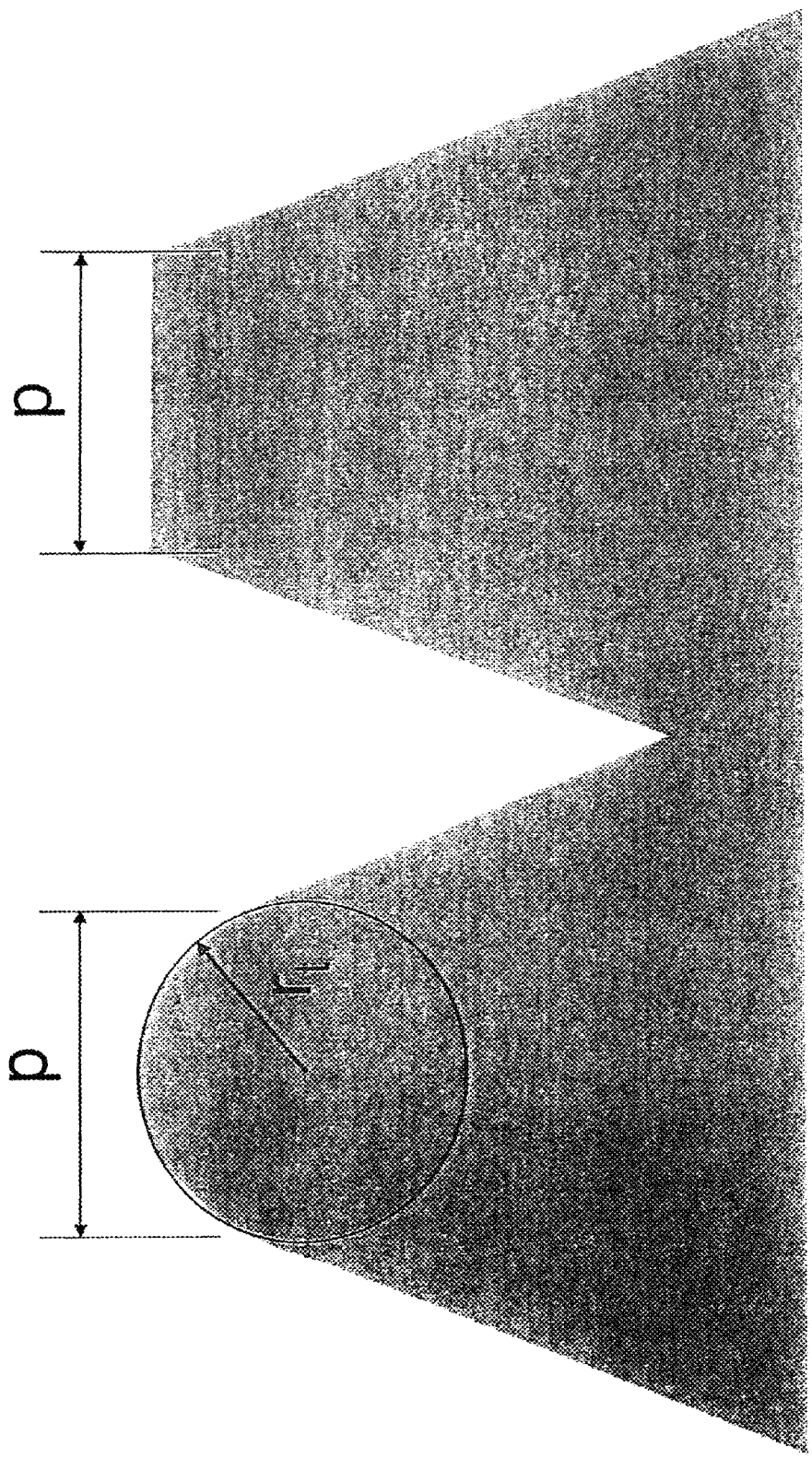
FIG. 10 depicts a means of characterizing the planarity of a dot's printing surface where p is the distance across the dot top, and $r_t$ is the radius of curvature across the surface of the dot.

Finally, the planarity of the top of a dot can be measured as the radius of curvature across the top surface of the dot, $r_t$, as shown in FIG. 10. It is noted that a rounded dot surface is not ideal from a printing perspective because the size of the contact patch between the print surface and the dot varies exponentially with impression force. Therefore, the top of the dot preferably has a planarity where the radius of curvature of the dot top is greater than the thickness of the photopolymer layer, more preferably twice the thickness of the photopolymer layer, and most preferably more than three times the total thickness of the photopolymer layer.

Figure 11:
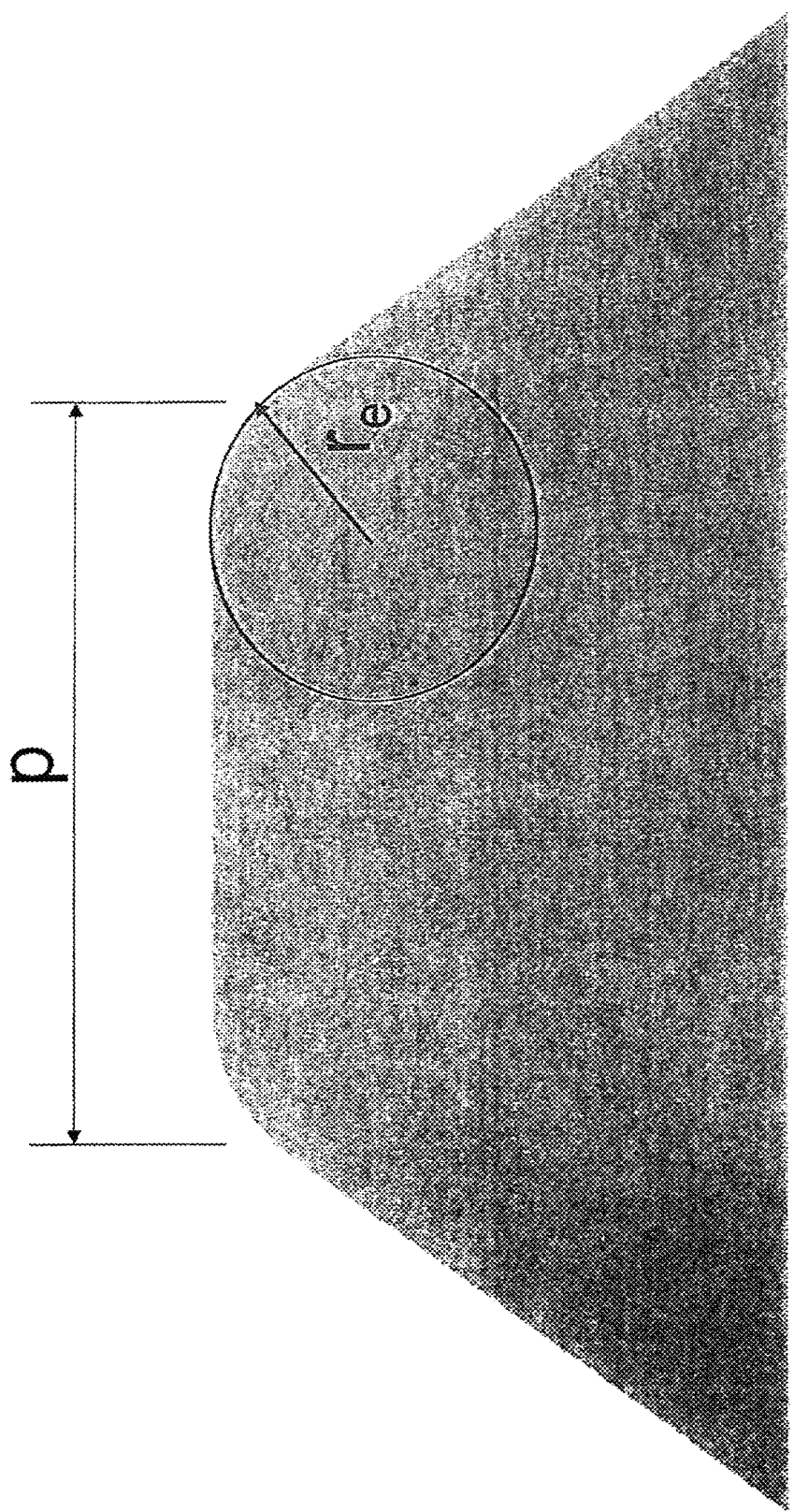
FIG. 11 depicts a flexo dot and its edge, where p is the distance across the dot top. This is used in the characterization of edge sharpness $r_e$:p, where $r_e$ is the radius of curvature at the intersection of the shoulder and the top of the dot.

Edge sharpness relates to the presence of a well-defined boundary between the planar dot top and the shoulder and it is generally preferred that the dot edges be sharp and defined, as shown in FIG. 11. These well-defined dot edges better separate the "printing" portion from the "support" portion of the dot, allowing for a more consistent contact area between the dot and the substrate during printing.

Figure 3:
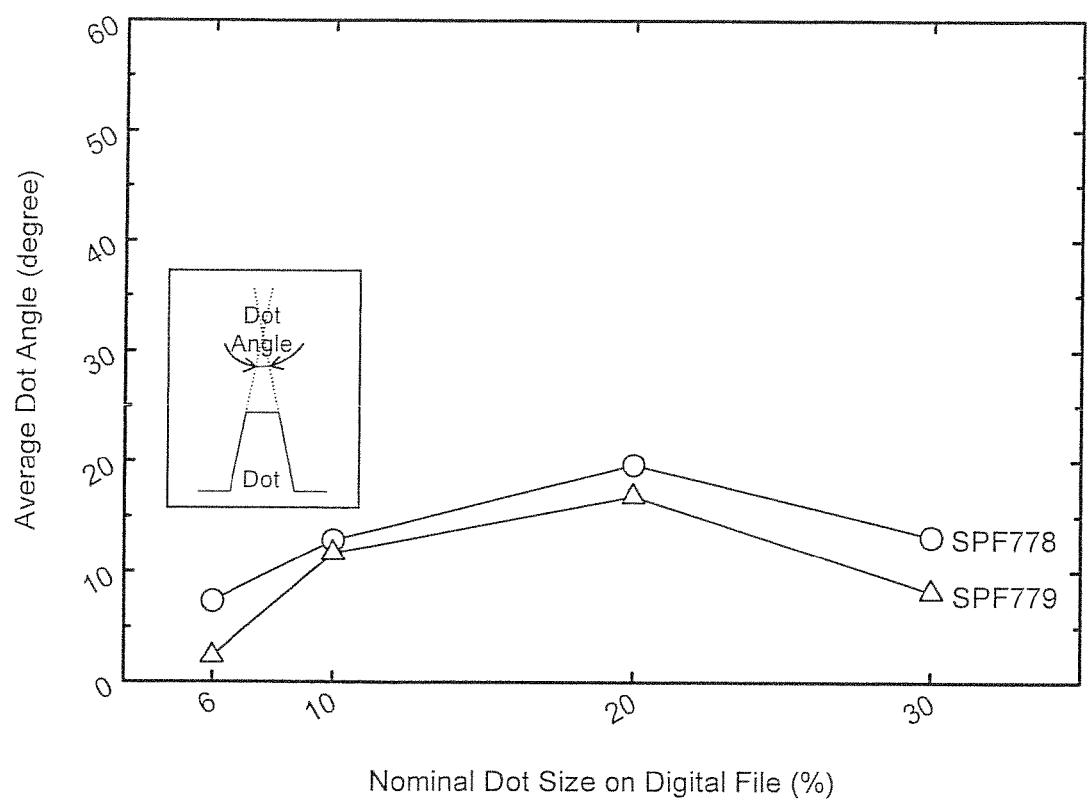
FIG. 3 depicts average dot shoulder angles of SPF778 and SPF779 with respect to dot-on-file.
Figure 4:
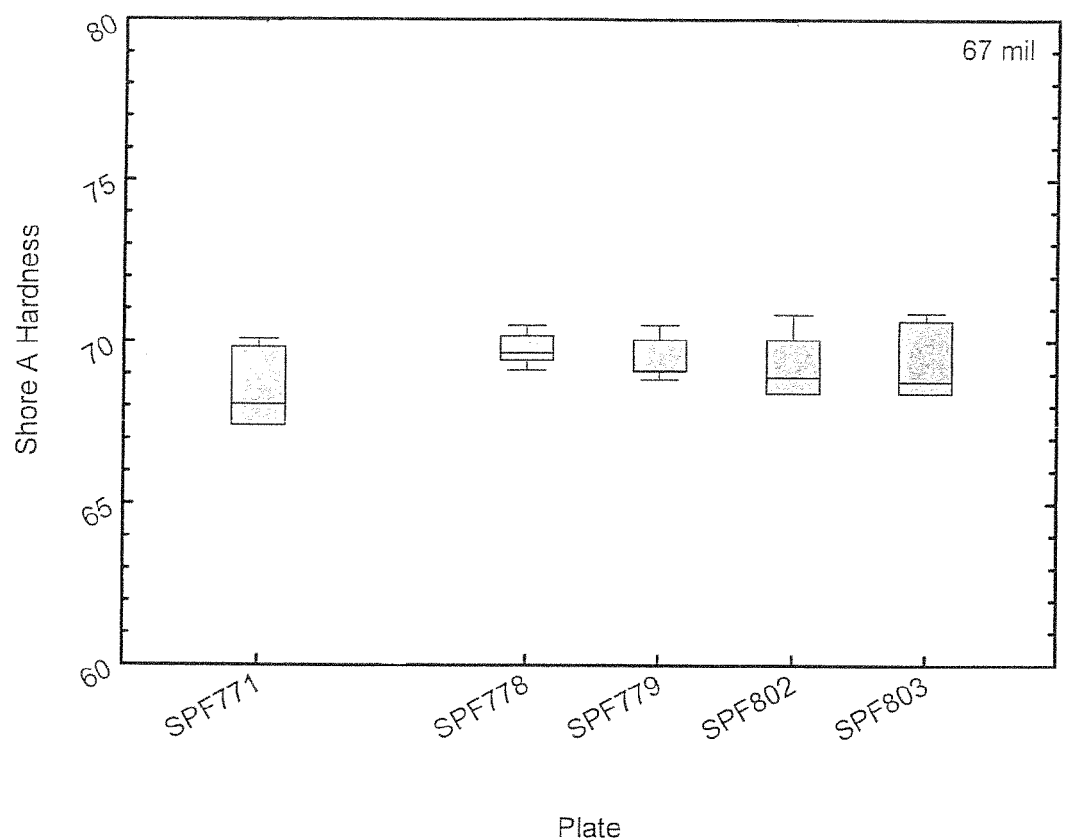
FIG. 4 depicts Shore A hardness of various 67 mil plates investigated.
Figure 5:
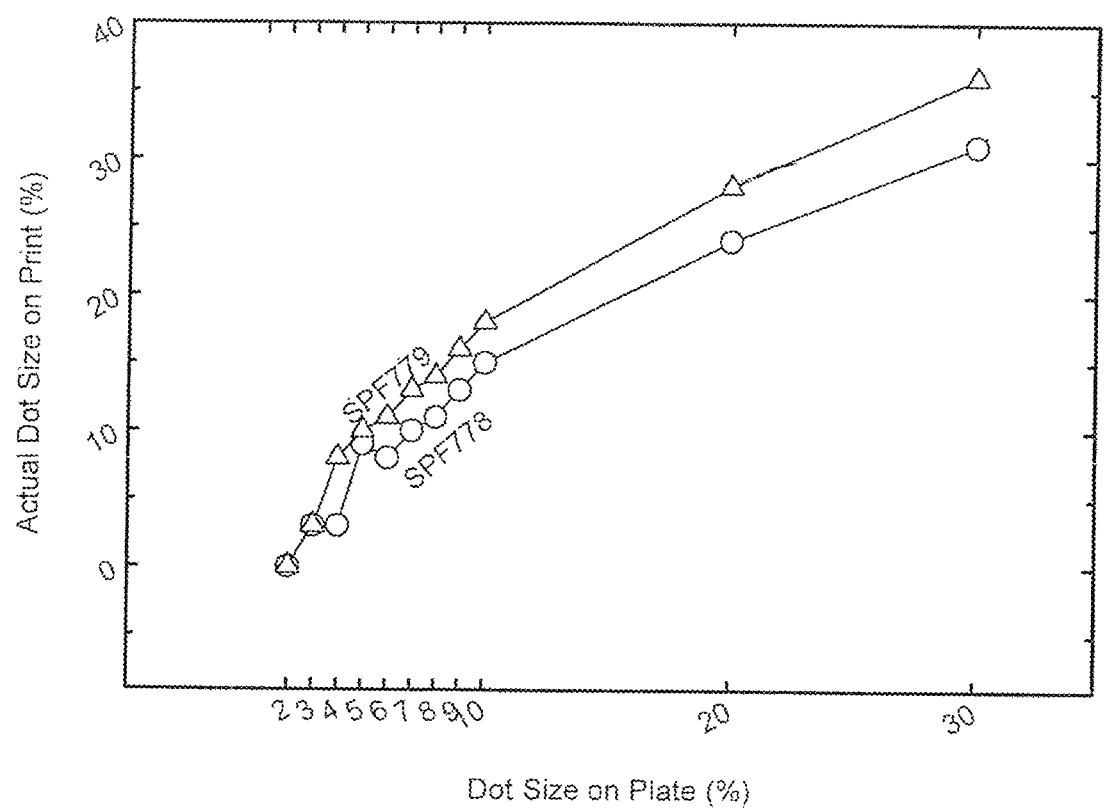
FIG. 5 depicts dot gain curves of thermally processed SPF778 and SPF779.
Figure 6:
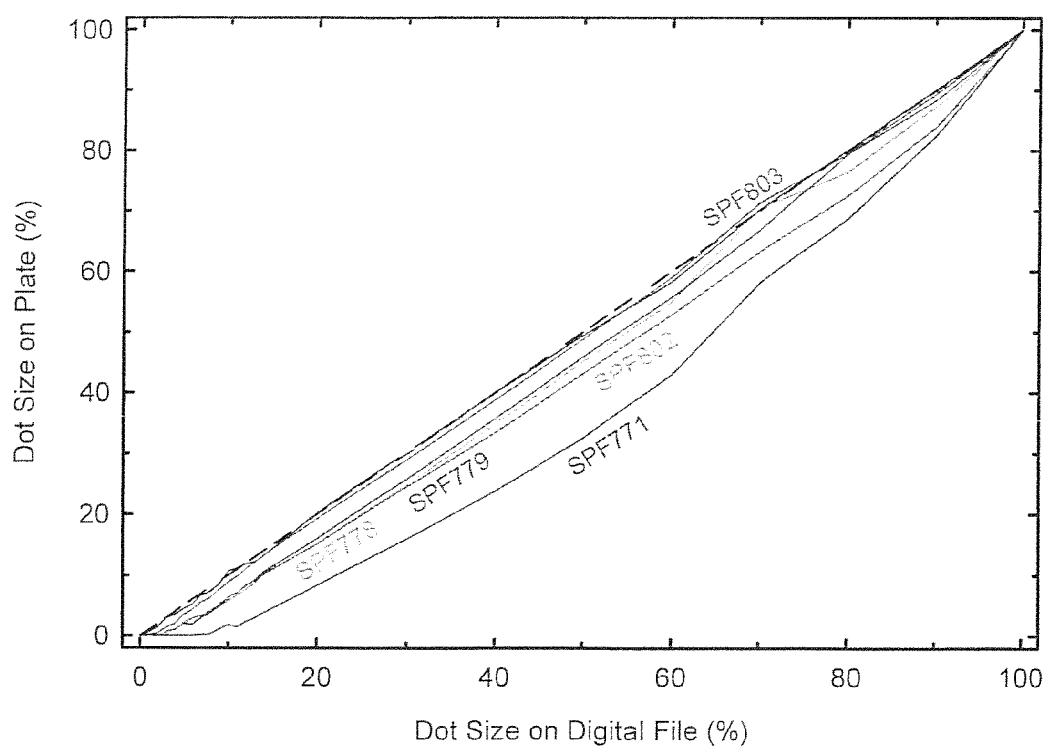
FIG. 6 depicts actual dot sizes of SPF778, SPF779, SPF771, SPF802 and SPF803 processed in solvent with respect to dot-on-file.
Figure 7A:
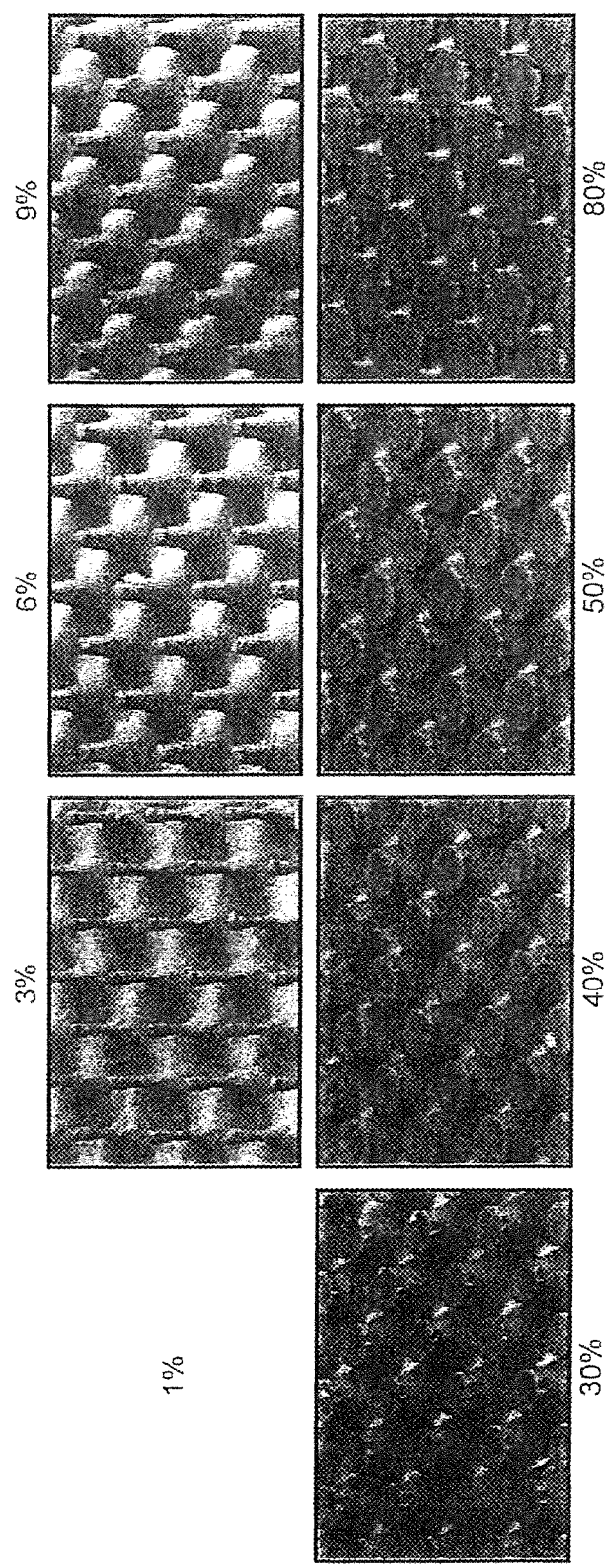
FIGS. 7A and 7B depict SEM pictures (150×) of solvent processed SPF802 and SPF803, as a function of various dot-on-file % at 150 lpi.
Figure 7B:
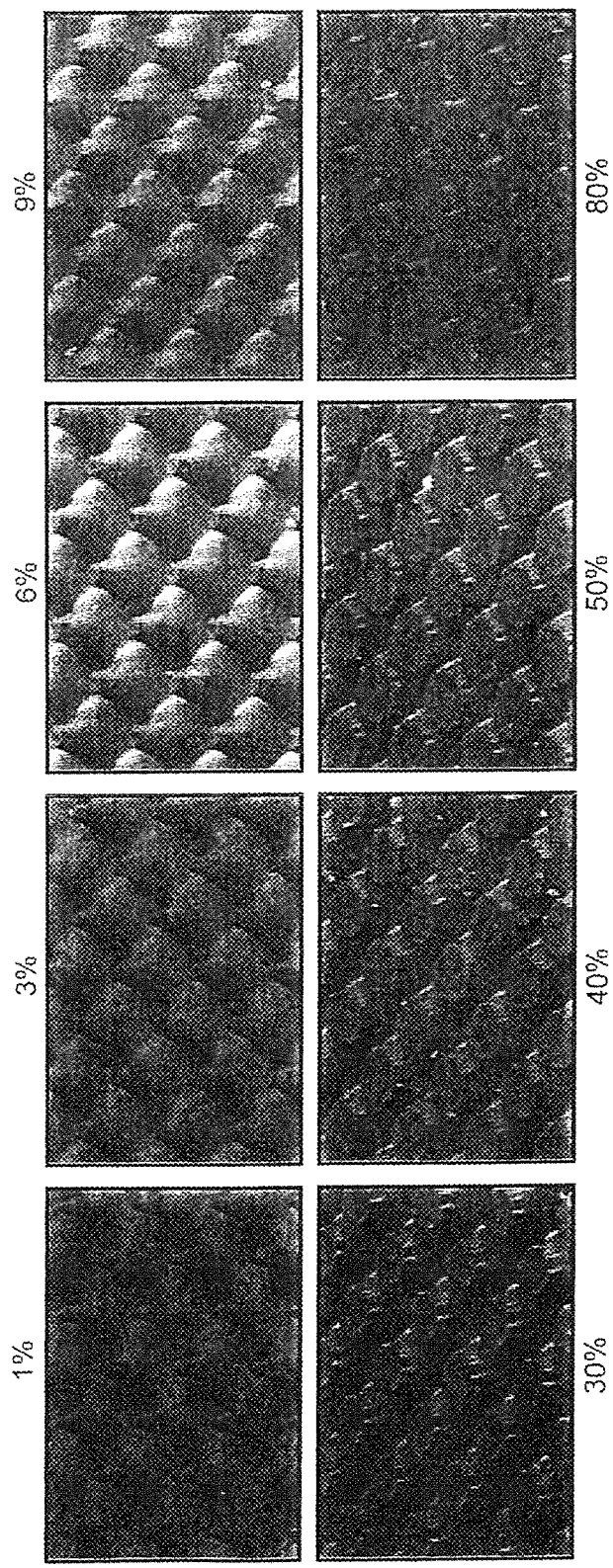

Edge sharpness can be defined as the ratio of $r_e$, the radius of curvature (at the intersection of the shoulder and the top of the dot) to p, the width of the dot's top or printing surface, as shown in FIG. 3. For a truly round-tipped dot, it is difficult to define the exact printing surface because there is not really an edge in the commonly understood sense, and the ratio of $r_e$:p can approach 50%. In contrast, a sharp-edged dot would have a very small value of $r_e$, and $r_e$:p would approach zero. In practice, an $r_e$:p of less than 5% is preferred, with an $r_e$:p of less than 2% being most preferred. FIG. 11 depicts a flexo dot and its edge, where p is the distance across the dot top and demonstrates the characterization of edge sharpness, $r_e$:p, where $r_e$ is the radius of curvature at the intersection of the shoulder and the top of the dot.

What is claimed is:

1. A relief image printing element produced from a photocurable printing blank, wherein the photocurable printing blank comprises:
   a) a support layer;
   b) one or more photocurable layers disposed on the support layer, wherein the one or more photocurable layers comprise:
      i) a binder;
      ii) one or more monomers;
      iii) a photoinitiator; and
      iv) an additive selected from the group consisting of phosphites, thioether amine compounds, and combinations of one or more of the foregoing;
   c) a laser ablatable masking layer disposed on the one or more photocurable layers, the laser ablatable masking layer comprising a radiation opaque material; and
   d) optionally, a removable coversheet,
   wherein the relief image printing element comprises a plurality of relief printing dots which relief printing dots comprise at least one of the following characteristics;
   (i) edge sharpness of the relief printing dots, defined as the ratio of the radius of curvature $r_e$ at the intersection of a shoulder and the top of the relief printing dot to the width of the dot's top printing surface p is less than 5%; or
   (ii) average shoulder angle, measured as the angle between a shoulder of the dot across the width of the dot's top printing surface, is less than 30°.

2. The photocurable relief image printing element according to claim 1, wherein the additive is a phosphite selected from the group consisting of tris(nonylphenyl)phosphite, triphenyl phosphite, diphenyl phosphite, tridecyl phosphite, triisodecyl phosphite, tris(tridecyl)phosphite, trilauryl phosphite, disteraryl pentaerythriol diphosphite, diisodecyl phenyl phosphite, diphenyl isodecyl phosphite, diphenyl octyl phosphite, diphenyl isooctyl phosphite, diphenyl tri isodecyl monophenyl dipropyleneglycol diphosphite, alkyl bisphenol A phosphite, tetraphenyl dipropyleneglycol diphosphite, poly(dipropyleneglycol) phenyl phosphite, tris(dipropylene glycol) phosphite, and dioleyl hydrogen phosphite and combinations of one or more of the foregoing.

3. The photocurable relief image printing element according to claim 2, wherein the additive comprises tris(nonylphenyl)phosphite.

4. A relief image printing element produced from a photocurable printing blank, wherein the photocurable printing blank comprises:
   a) a support layer;
   b) one or more photocurable layers disposed on the support layer, wherein the one or more photocurable layers comprise:
      i) a binder;
      ii) one or more monomers;
      iii) a photoinitiator; and
      iv) an additive selected from the group consisting of phosphites, phosphines, thioether amine compounds, and combinations of one or more of the foregoing; and
      v) an antioxidant selected from the group consisting of 1,3,5-trimethyl-2,4,6-tris(3,5-di-tert-butyl-4-hydroxybenzyl)benzene, alkylated phenols, alkylated bis-phenols, polymerized trimethyldihydroquinone, dilauryl thiopropionate, and combinations of one or more of the foregoing;
   c) a laser ablatable masking layer disposed on the one or more photocurable layers, the laser ablatable masking layer comprising a radiation opaque material; and
   d) optionally, a removable coversheet;
   wherein the relief image printing element comprises a plurality of relief printing dots which relief printing dots comprise at least one of the following characteristics;
   (i) edge sharpness of the relief printing dots, defined as the ratio of the radius of curvature $r_e$ at the intersection of a shoulder and the top of the relief printing dot to the width of the dot's top printing surface p is less than 5%; or
   (ii) average shoulder angle, measured as the angle between a shoulder of the dot across the width of the dot's top printing surface, is less than 30°.

5. The photocurable relief image printing element according to claim 1, wherein the additive is a thioether amine compound selected from the group consisting of 2,6-di-tert-butyl-4-(4,6-bis(octylthio)-1,3,5-triazin-2-ylamino)phenol, 4-[[4,6-bis(nonylsulfanyl)-1,3,5-triazin-2-yl]amino]-2,6-di-tert-butylphenol, 4-[[4,6-bis(octadecylsulfanyl)-1,3,5-triazin-2-yl]amino]-2,6-ditert-butylphenol, 4-[[4,6-octylsulfanyl)-1,3,5-triazin-2-yl]amino]-2,6-bis(2-methylnonan-2-yl)phenol, 4-[[4,6-bis(hexylsulfanyl)-1,3,5-triazin-2-yl]

amino]-2,6-ditert-butylphenol, 4-[[4,6-bis(heptylsulfanyl)-1,3,5-triazin-2-yl]amino]-2,6-ditert-butylphenol, 4-[[4,6-bis(octylsulfanyl)-1,3,5-triazin-2-yl]amino]-2-tert-butyl-6-methylphenol, 4-[[4,6-bis(ethylsulfanyl)-1,3,5-triazin-2-yl]amino]-2,6-ditert-butylphenol, 4-[[4,6-bis(2,4,4-trimethylpentan-2-ylsulfanyl)-1,3,5-triazin-2-yl]amino]-2,6-ditert-butylphenol, 4-[[4,6-bis(2-octylsulfanylethylsulfanyl)-1,3,5-triazin-2-yl]amino]-2,6-ditert-butylphenol, 4-[[4,6-bis(octylsulfanyl)-1,3,5-triazin-2-yl]amino]-2,6-dibutylphenol, 4-[[4,6-bis(octylsulfanyl)-1,3,5-triazin-2-yl]amino]-2,6-dimethylphenol, 2,6-ditert-butyl-4-[[4-(3,5-ditert-butyl-4-hydroxyanilino)-6-octylsulfanyl-1,3,5-triazin-2-yl]amino]phenol, 4-[[4,6-bis(pentylsulfanyl)-1,3,5-triazin-2-yl]amino-2,6-dimethylphenol, 4-[[4,6-bis(hexylsulfanyl)-1,3,5-triazin-2-yl]amino]-2-tert-butylphenol, 2,6-ditert-butyl-4-[(4-octylsulfanyl-1,3,5-triazin-2-yl)amino]phenol, 4-[[4,6-bis(ethylsulfanyl)-1,3,5-triazin-2-yl]amino]-2,6-dimethylphenol, 4-[[4,6-bis(octylsulfanyl)-1,3,5-triazin-2-yl]-butylamino]-2,6-ditert-butylphenol, 4-[[4,6-bis(octylsulfanyl)-1,3,5-triazin-2-yl]-cyclohexylamino]-2,6-ditert-butylphenol, 2-[[4,6-bis(octylsulfanyl)-1,3,5-triazin-2-yl]amino]-6-tert-butylphenol, 2-tert-butyl-6-methyl-4-[[4-octylsulfanyl-6-[(2,2,6,6,-tetramethylpiperidin-4-yl)amino]-1,3,5-triazin-2-yl]amino]phenol, 4-[[4,6-bis(octylsulfanylmethyl)-1,3,5-triazin-2-yl)amino]-2,6-ditert-butylphenol, 4-[[4,6-bis(octylsulfanyl)-1,3,5-triazin-2-yl)methylamino]-2,6-ditert-butylphenol, 4-[(4-amino-6-chloro-1,3,5-triazin-2-yl)amino]-2,6-ditert-butylphenol, and 4-[(4-cyclohexyl-6-cyclohexylsulfanyl-1,3,5-triazin-2-yl)amino]-2,6-di(propan-2-yl)phenol.

6. The photocurable relief image printing element according to claim 5, wherein the additive comprises 2,6-di-tert-butyl-4-(4,6-bis(octylthio)-1,3,5-triazin-2-ylamino)phenol.

7. The photocurable relief image printing element according to claim 1, wherein the one or more photocurable layers comprise an antioxidant selected from the group consisting of 1,3,5-trimethyl-2,4,6-tris(3,5-di-tert-butyl-4-hydroxybenzyl)benzene, butylated hydroxytoluene, polymerized trimethyldihydroquinone, dilauryl thiopropionate, and combinations of one or more of the foregoing.

8. The photocurable relief image printing element according to claim 7, wherein the antioxidant comprises 1,3,5-trimethyl-2,4,6-tris(3,5-di-tert-butyl-4-hydroxybenzyl)benzene.

9. The photocurable relief image printing element according to claim 1, wherein the one or more photocurable layers comprise one or more materials selected from the group consisting of plasticizers, antiozonants, fillers, reinforcing agents, thermal polymerization inhibitors, UV absorbers and combinations of one or more of the foregoing.

10. The photocurable relief image printing element according to claim 9, wherein the one or more materials comprise a plasticizer.

11. The photocurable relief image printing element according to claim 1, wherein the photocurable relief image printing element has a Shore A hardness of between 45 and 70.

12. The photocurable relief image printing element according to claim 11, wherein the photocurable relief image printing element has a Shore A hardness of between 50 and 65.

13. The photocurable relief image printing element according to claim 4, wherein the additive is a phosphine selected from the group consisting of triphenyl phosphine, tri-p-tolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, divinyl-p-bromophenylphosphine, and diallyl-p-tolylphosphine and combinations of one or more of the foregoing.

14. A photocurable printing blank comprising:
a) a support layer;
b) one or more photocurable layers disposed on the support layer, wherein the one or more photocurable layers comprise:
 i) a binder;
 ii) one or more monomers;
 iii) a photoinitiator; and
 iv) an additive, wherein the additive comprises a thioether amine compound, and combinations of one or more of the foregoing;
c) a laser ablatable masking layer disposed on the one or more photocurable layers, the laser ablatable masking layer comprising a radiation opaque material; and
d) optionally, a removable coversheet,
wherein the photocurable printing blank is capable of being selectively crosslinked and cured upon exposure to UV light and then developed to reveal a relief image therein, wherein the relief image comprises a plurality of relief printing dots, and
wherein the presence of the additive in the at least one photocurable layer enhances surface cure of the one or more photocurable layers without requiring a high intensity UV light source, an inert gas chamber, or a laminated membrane.

15. The photocurable printing blank according to claim 14, wherein the additive further comprises a phosphite selected from the group consisting of tris(nonylphenyl) phosphite, triphenyl phosphite, diphenyl phosphite, tridecyl phosphite, triisodecyl phosphite, tris(tridecyl)phosphite, trilauryl phosphite, disteraryl pentaerythriol diphosphite, diisodecyl phenyl phosphite, diphenyl isodecyl phosphite, diphenyl octyl phosphite, diphenyl isooctyl phosphite, diphenyl tri isodecyl monophenyl dipropyleneglycol diphosphite, alkyl bisphenol A phosphite, tetraphenyl dipropyleneglycol diphosphite, poly(dipropyleneglycol) phenyl phosphite, tris(dipropylene glycol) phosphite, and dioleyl hydrogen phosphite and combinations of one or more of the foregoing.

16. The photocurable printing blank according to claim 14, wherein the additive further comprises a phosphine selected from the group consisting of triphenyl phosphine, tri-p-tolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, divinyl-p-bromophenylphosphine, and diallyl-p-tolylphosphine and combinations of one or more of the foregoing.

17. The photocurable printing blank according to claim 14, wherein the thioether amine compound is selected from the group consisting of 2,6-di-tert-butyl-4-(4,6-bis(octylthio)-1,3,5-triazin-2-ylamino)phenol, 4-[[4,6-bis(nonylsulfanyl)-1,3,5-triazin-2-yl]amino]-2,6-ditert-butylphenol, 4-[[4,6-bis(octadecylsulfanyl)-1,3,5-triazin-2-yl]amino]-2,6-ditert-butylphenol, 4-[[4,6-octylsulfanyl)-1,3,5-triazin-2-yl]amino]-2,6-bis(2-methylnonan-2-yl)phenol, 4-[[4,6-bis(hexylsulfanyl)-1,3,5-triazin-2-yl]amino]-2,6-ditertbutylphenol, 4-[[4,6-bis(heptylsulfanyl)-1,3,5-triazin-2-yl]amino]-2,6-ditert-butylphenol, 4-[[4,6-bis(octylsulfanyl)-1,3,5-triazin-2-yl]amino]-2-tert-butyl-6-methylphenol, 4-[[4,6-bis(ethylsulfanyl)-1,3,5-triazin-2-yl]amino]-2,6-ditert-butylphenol, 4-[[4,6-bis(2,4,4-trimethylpentan-2-ylsulfanyl)-1,3,5-triazin-2-yl]amino]-2,6-ditert-butylphenol, 4-[[4,6-bis(2-octylsulfanylethylsulfanyl)-1,3,5-triazin-2-yl]amino]-2,6-ditert-butylphenol, 4-[[4,6-bis(octylsulfanyl)-1,3,5-triazin-2-yl]amino]-2,6-dibutylphenol, 4-[[4,6-bis(octylsulfanyl)-1,3,5-triazin-2-yl]amino]-2,6-dimethylphenol, 2,6-ditert-butyl-4-[[4-(3,5-ditert-butyl-4-hydroxyanilino)-6-octylsulfanyl-1,3,5-triazin-2-yl]amino]phenol, 4-[[4,6-bis(pentylsulfanyl)-1,3,5-triazin-2-yl]amino-2,6-dimethylphenol, 4-[[4,6-bis(hexylsulfanyl)-1,3,5-triazin-2-yl]amino]-2-tert-butylphenol, 2,6-ditert-butyl-4-[(4-octylsulfanyl-1,3,5-triazin-2-yl)amino]phenol, 4-[[4,6-bis(ethylsulfanyl)-1,3,5-triazin-2-yl]amino]-2,6-dimethylphenol, 4-[[4,6-bis(octylsulfanyl)-1,3,5-triazin-2-yl]-butylamino]-2,6-ditert-butylphenol, 4-[[4,6-bis(octylsulfanyl)-1,3,5-triazin-2-yl]-cyclohexylamino]-2,6-ditert-butylphenol, 2-[[4,6-bis(octylsulfanyl)-1,3,5-triazin-2-yl]amino]-6-tert-butylphenol, 2-tert-butyl-6-methyl-4-[[4-octylsulfanyl-6-[(2,2,6,6,-tetramethylpiperidin-4-yl)amino]-1,3,5-triazin-2-yl]amino]phenol, 4-[[4,6-bis(octylsulfanylmethyl)-1,3,5-triazin-2-yl)amino]-2,6-ditert-butylphenol, 4-[[4,6-bis(octylsulfanyl)-1,3,5-triazin-2-yl)methylamino]-2,6-ditert-butylphenol, 4-[(4-amino-6-chloro-1,3,5-triazin-2-yl)amino]-2,6-ditert-butylphenol, and 4-[(4-cyclohexyl-6-cyclohexylsulfanyl-1,3,5-triazin-2-yl)amino]-2,6-di(propan-2-yl)phenol.

\* \* \* \* \*